(12) United States Patent
Hori et al.

(10) Patent No.: US 7,012,332 B2
(45) Date of Patent: Mar. 14, 2006

(54) SEMICONDUCTOR DEVICE HAVING SEALING STRUCTURE FOR WIDE GAP TYPE SEMICONDUCTOR CHIP

(75) Inventors: Yukitaka Hori, Fukuoka (JP); Katsumi Satoh, Tokyo (JP); Norihisa Asano, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 47 days.

(21) Appl. No.: 10/669,558

(22) Filed: Sep. 25, 2003

(65) Prior Publication Data

US 2004/0070059 A1    Apr. 15, 2004

(30) Foreign Application Priority Data

Oct. 11, 2002   (JP)   .............................. 2002-298626

(51) Int. Cl.
*H01L 23/48* (2006.01)
*H01L 23/52* (2006.01)
*H01L 29/40* (2006.01)

(52) U.S. Cl. ...................... 257/735; 257/744; 257/734; 257/743

(58) Field of Classification Search ................ 257/735, 257/744, 734, 743
See application file for complete search history.

(56) References Cited

U.S. PATENT DOCUMENTS 6,140,906 A * 10/2000 Kaihara et al. ........... 338/22 R
2004/0027502 A1 * 2/2004 Tanaka ........................ 349/40

FOREIGN PATENT DOCUMENTS

| JP | 62-205635 | 9/1987 |
|---|---|---|
| JP | 64-65870 | 3/1989 |
| JP | 5-144853 | 6/1993 |
| JP | 8-102553 | 4/1996 |
| JP | 2000-106444 | 4/2000 |
| JP | 2001-24004 | 1/2001 |

* cited by examiner

*Primary Examiner*—Long Pham
(74) *Attorney, Agent, or Firm*—Oblon, Spivak, McClelland, Maier & Neustadt, P.C.

(57) ABSTRACT

A semiconductor chip and connection ends of corresponding external electrode terminals are encapsulated with a glass based sealing material, and the semiconductor chip includes a wide gap semiconductor element, and the electrodes of the semiconductor chip are connected to the end portions of the external electrode terminals by a silver based brazing member and/or pressure contact.

7 Claims, 3 Drawing Sheets

SEMICONDUCTOR DEVICE HAVING SEALING STRUCTURE FOR WIDE GAP TYPE SEMICONDUCTOR CHIP

BACKGROUND OF THE INVENTION

1. Field of the Invention

The present invention relates to a semiconductor device and more particularly to a semiconductor device having a semiconductor chip made of silicon carbide or gallium nitride mounted on a substrate for improvement of the connecting conduction of chip electrodes, which can thus be operated at a higher temperature.

2. Description of the Related Art

Semiconductor devices such as diodes, transistors, semiconductor lasers, and integrated circuits are widely utilized in a variety of industries. A most common type of the semiconductor devices is based on a single semi-conductive element such as general-purpose silicon (Si).

Such a known semiconductor device will now be explained as an example referring to a conventional discrete MOSFET which is generally used in a household apparatus or a switching source.

A MOSFET chip has a source electrode and a gate electrode provided on a front side of a substrate thereof made of a semiconductor material such as single element silicon, and has a drain electrode provided on the back side of the substrate. The drain electrode is soldered by a tin based soldering material to a metal frame, and then the source electrode and the gate electrode are electrically connected to an external source terminal and an external gate terminal, respectively, through metal wires which are connected by ultrasonic welding and the like. The MOSFET chip is then encapsulated in a molding resin such as epoxy resin which can be cured at a temperature lower than the melting point of a soldering material, so that the surfaces of MOSFET chip and the metal wires can not be exposed. The molding resin is then heated and cured.

As mentioned above, the general-use of a semi-conductive element such as silicon of a single element is known in the prior art. However, the use of a single semi-conductive element may be unfavorable in thermal and chemical stability, mechanical strength, and environmental durability.

Recently, the single semi-conductive element such as silicon (Si) has hence been replaced by other compound semiconductors which are favorably high in the environmental durability, and now ready for practical use, including such as silicon carbide (SiC), gallium arsenide (GaAs), and gallium nitride (GaN).

For example, as for the semiconductor technology with silicon carbide in relation to an environmental temperature and Schottky properties, a technology of the silicon carbide semiconductor is disclosed, in which the thermal stability can be increased and the semiconductor device can thus be operated in a higher temperature (for example, referred to Patent document 1: Japanese Patent Laid-open Publication 2000-106444).

Also, another modification is disclosed where the semiconductor of silicon carbide is increased in thermal stability and can be used at a higher temperature as being applicable to a large electric power device (for example, referred to Patent document 2: Japanese Patent Laid-open Publication (Showa) 64-65870).

The compound semiconductors such as silicon carbide and gallium nitride are greater in energy gap between bands than the single semiconductor such as silicon and can thus be improved in the thermal stability. Accordingly, semiconductor devices using silicon carbide or gallium nitride can be operated at a high temperature up to 1000 Kelvin, and is advantageously arranged with a higher density.

Moreover, the silicon carbide or gallium nitride semiconductor is substantially ten times greater in strength of a breakdown electric field and can thus minimize the width of a depletion layer for inhibiting a given level of voltage. Accordingly, in the inhibiting state of a given level of voltage, the semiconductor device arranged operable under a particular condition where a high voltage is generated may be made preferably of a compound semiconductor such as silicon carbide or gallium nitride. In other words, the semiconductor device of silicon carbide or gallium nitride can significantly be reduced in thickness than any single silicon semiconductor device for holding the voltage at a given level.

Thus, as the distance between the cathode and the anode can be reduced, the voltage drop substantially proportional to the electrode distance can be minimized during a flow of current. More particularly, the normal loss derived from the voltage drop during the current flow will be minimized. As the result, a diode or switching device based on silicon carbide or silicon nitride can remain lower in both the normal loss and the conversion loss during the switching action than any single silicon based semiconductor device. Also, the silicon carbide device is operable at a higher temperature than that of any single silicon based device, and therefore its cooling mechanism specifically such as a heatsink and the like can hence be simplified when it acts as a power switching device.

The conventional sealing material for encapsulating a semiconductor chip is commonly an organic resin such as epoxy resin which may be decomposed when its temperature reaches higher than about 200° C. Its ionized particles will hence adhere to the semiconductor chip, which is thus declined in performance. Since the temperature of the sealing material such as epoxy resin is limited, the thermal stability pertinent to the semiconductor chip can not be implemented at its maximum level.

Whereas, an usable temperature limit of 170° C. in case of using the conventional epoxy resin as a sealing material for encapsulating a semiconductor chip and its electrodes can be increased to a temperature range from 350° C. to 450° C. when glass material is used instead of the epoxy resin (for example, referred to Patent document 3: Japanese Patent Laid-open Publication 62-205635).

Thus, when the compound semiconductor materials such as silicon carbide or gallium nitride are used in place of the known single semiconductor materials, the conventional semiconductor devices are successfully improved in antinomy relationship between the conversion loss and the normal loss during the switching action, unlike the silicon single material devices. However, the conventional semiconductor devices fail to overcome the problem of increase in a heat release value in a device which controls a great current flow.

Also, in the conventional semiconductor device, as the semiconductor chip electrodes are connected to external electrode terminals by soldering, its production procedure will be less simple and thus unfavorable in view of the productivity and production cost.

It is essential to secure the connections between the electrodes of the semiconductor chip and the corresponding external electrode terminals for allowing no disconnection of the semiconductor chip from the external electrode terminals. The greater the current control, the higher the heat energy will be increased. This requires the connections between the electrodes of the semiconductor chip and the corresponding external electrode terminals to have a higher level of heat radiation performance.

If the current flowing through the metal wires is increased, it may generate undesired heat or cause a voltage drop across the metal wires. In the case where the semiconductor device is implemented in a large power module form, its wiring arrangement increases in size and number and will take more time for installation, thus declining the production efficiency.

To achieve an inherent advantage that a semiconductor chip made of a compound semiconductor material such as silicon carbide or gallium nitride is operable in a high-temperature, it is hence desired for the sealing material for encapsulating the semiconductor chip and its electrodes to improve in heat resistance. The connection part between an external electrode on the surface of the semiconductor chip and the corresponding external electrode terminals are also required to be of a configuration having a higher heat resistance and a high-efficiency in radiation of the heat.

SUMMARY OF THE INVENTION

The present invention has been developed for attaining the foregoing requirements and its object is to provide a semiconductor device which can minimize the voltage drop during a current flowing to operate at optimum with an advantage of its semiconductor chip for high heat resistance while remaining decreased in size and weight, thus improving the operational reliability.

It is another object of the present invention to improve the connections between the electrodes of the semiconductor chip and their corresponding external electrode terminals for simplifying the production procedure, increasing the productivity, and minimizing the production cost.

It is a further object of the present invention to provide a semiconductor device which has the connections between the electrodes of the semiconductor chip and their corresponding external electrode terminals improved in contact resistance and arranged to have a high temperature resistance as well as effectiveness for radiation of the heat.

For achievement of the objects of the present invention, a semiconductor chip is made of silicon carbide or gallium nitride and encapsulated together with electrodes provided on the front surface thereof in a glass based sealing material while the electrodes of the semiconductor chip are integrally connected to their corresponding external electrode terminals by pressing means or a high-temperature brazing material for improving the effectiveness of radiating heat.

According to a preferred form of the present invention, a semiconductor device having a sealing structure for a semiconductor chip, includes: a plurality of main electrodes provided on main surfaces of the semiconductor chip; a plurality of external electrodes electrically connected to the main electrodes via connection members, respectively; a sealing member made of a glass based sealing material for encapsulating at least the semiconductor chip, the main electrodes and the connection members; and a brazing member made of a silver based brazing material having a high fusing point. The brazing member is provided for integrally connecting between a part of the main electrodes and a part of the external electrodes. In this construction, the semiconductor chip is of a wide gap type, and the fusing point of the glass based sealing material is lower than that of the silver based brazing material.

According to another form of the present invention, a semiconductor device having a sealing structure for a semiconductor chip, includes: a plurality of main electrodes provided on main surfaces of the semiconductor chip; a plurality of external electrodes directly and electrically connected to the main electrodes by pressure contact, respectively; and a sealing member made of a glass based sealing material for encapsulating at least the semiconductor chip, the main electrodes and connected portions of the external electrodes, wherein the semiconductor chip is of a wide gap type.

BRIEF DESCRIPTION OF THE DRAWINGS

These and other objects and features of the present invention will be readily understood from the following detailed description taken in conjunction with preferred embodiments thereof with reference to the accompanying drawings, in which.

DESCRIPTION OF THE PREFERRED EMBODIMENTS

Preferred embodiments of the present invention will be described in more detail referring to the accompanying drawings. It is noted that, the embodiments are illustrated in the form of, but not limited to, a discrete MOSFET which is commonly used as a semiconductor device in a household appliance and a switching power supply. The semiconductor device of the present invention may be implemented as a MESFET and any other applicable form. Also, like components are denoted by like numerals throughout the drawings and will be explained with no repeat.

(Embodiment 1)

Figure 1A:
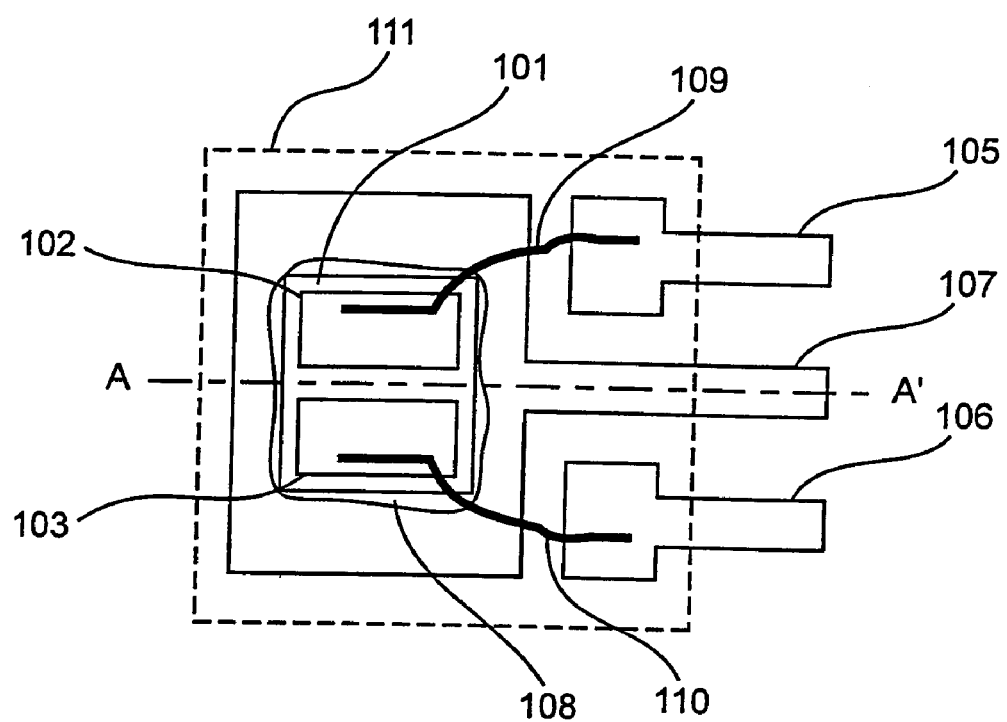
FIG. 1A is an upper view of a semiconductor device according to an embodiment 1 of the present invention.
Figure 1B:
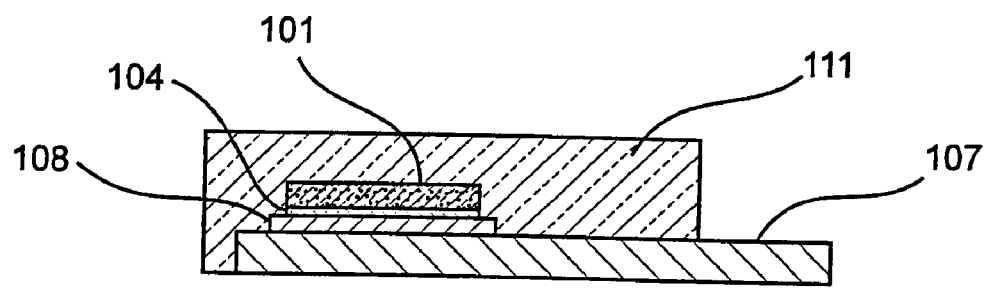
FIG. 1B is a cross sectional view taken along the line A–A' in FIG. 1A.

FIG. 1A is an upper view of a MOSFET showing an embodiment 1 of the present invention. FIG. 1B is a cross sectional view taken along the line A–A' in FIG. 1A.

In the MOSFET shown in FIGS. 1A and 1B, reference numeral 101 denotes a MOSFET chip which is made of a silicon carbide or gallium nitride material. The MOSFET chip is comprised of a semiconductor element of a wide gap type. A source electrode 102 and a gate electrode 103 are provided on the front surface of the chip while a drain electrode 104 is provided on the back surface thereof.

The drain electrode 104 is integrally brazed by a brazing material 108 of a high melting point to an upper end of a metal frame 107 which serves as an external drain terminal. The brazing material 108 may be a silver based high-temperature fusible material or its eutectic alloy which is higher in heat resistance than common soldering materials and serves as a passage for effectively dissipating heat generated during current application, via a cooling mechanism (not shown) to the outside.

After brazing the drain electrode 104, the source electrode 102 and the gate electrode 103 are connected by wire bonding, e.g. ultrasonic fusing, of metal wires 109 and 110, which serve as draw-out electrode leads, to an external source terminal 105 and an external gate terminal 106 respectively. The semiconductor chip of this embodiment employs a connecting technique with no use of known soldering between the electrodes and their corresponding external terminals.

The MOSFET chip 101 is then encapsulated in a molding material 111, such as multi-component glass using heating units for melting (not shown), which has a fusing point of about 500° C., to allow no exposure of the metal wires 109 and 110. The glass molding material 111 is gradually cooled down and cured for the encapsulation. Notably, the fusing point (as well as the curing point) of the glass molding material 111 is significantly lower than that of the brazing material 108. This allows the MOSFET to be operated at a high temperature such as about 400° C.

The semiconductor chip of this embodiment is made of silicon carbide or gallium nitride materials and sealed with the glass based sealing material to encapsulate its electrodes at the surface, whereby the heat resistance can be improved. Moreover, as the drain electrode and the external drain terminal are integrally connected to each other by the high-temperature brazing material, the radiation of heat can be effectively dissipated and the contact resistance between the semiconductor chip and the external terminals can be improved. Accordingly, the inherent advantage of the semiconductor chip which is operable under a high-temperature condition will be ensured. Moreover, as the semiconductor chip is of a wide gap type, its heat resistance can be improved.

In addition, as the electrodes on the surface of the semiconductor chip are integrally connected to their corresponding external terminals by the high-temperature brazing material, the connected portions per se can be improved in heat resistance as well as in radiation of heat. Accordingly, the semiconductor device of this embodiment can be made low in energy loss at high voltages and decreased in overall size and weight.

Alternatively, also the source and gate electrodes of the semiconductor chip may be connected to the corresponding external electrodes by a high-temperature fusible brazing material which contains silver as a main ingredient as described above without using the wire bonding.

(Embodiment 2)

Figure 2A:
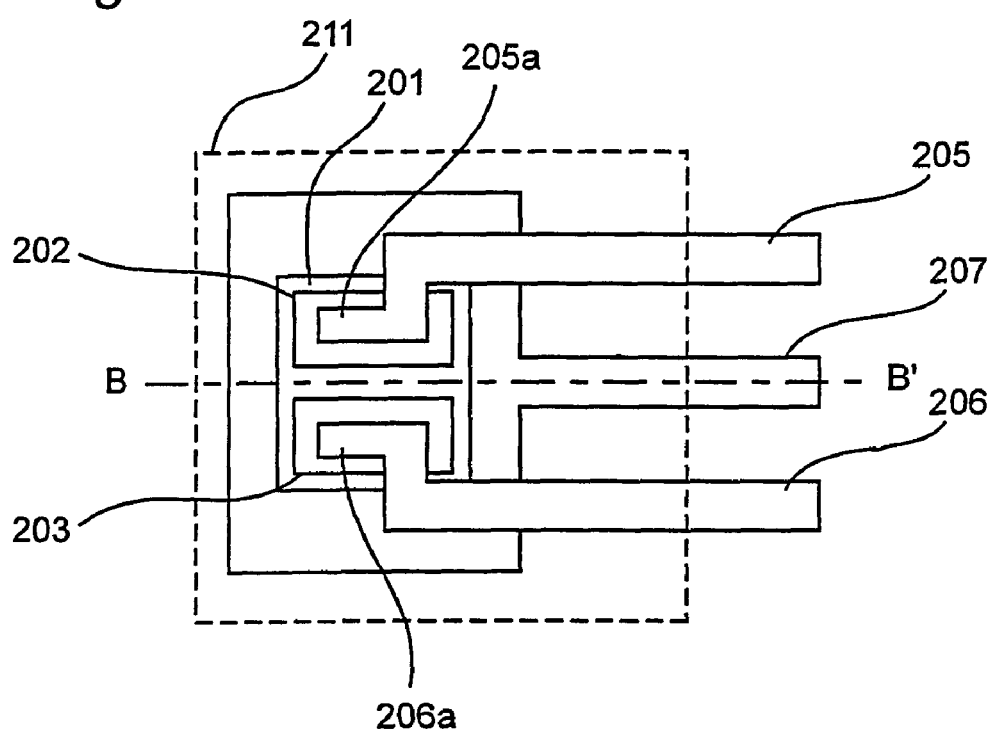
FIG. 2A is an upper view of a semiconductor device according to an embodiment 2 of the present invention.
Figure 2B:
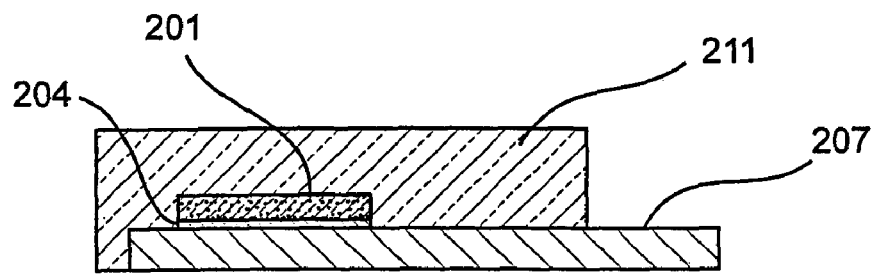
FIG. 2B is a cross sectional view taken along the line B–B' in FIG. 1B.

FIG. 2A is an upper side view of a semiconductor device according to an embodiment 2 of the present invention. FIG. 2B is a cross sectional view taken along the line B–B' in FIG. 2A. The MOSFET chip 201 of this embodiment is made of a compound semiconductor material such as silicon carbide or gallium nitride and has a source electrode 202 and a gate electrode 203 provided on the front surface thereof and a drain electrode 204 provided on the back surface thereof. The drain electrode 204 is mounted directly on an upper end of a metal frame 207 which serves as an external drain terminal.

The source electrode 202 is connected under the pressure of a loading means such as a pressing contactor, which will be described later, to a joint end 205a of an external source electrode terminal 205. Similarly, the gate electrode 203 is connected under the pressure of a loading means to a joint end 206a of an external gate electrode terminal 206. The semiconductor chip of this embodiment like the embodiment 1 is formed of a wide gap semiconductor element.

With the external electrodes 205, 206, and 207 connected to their corresponding electrodes in a pattern, the MOSFET chip 201 is encapsulated in a molding material 211 of multi-component glass material which has a melting point of about 500° C. using the same fusing manner as of the embodiment 1 so as to cover the surfaces of the MOSFET chip 201 and encapsulate the connection ends of the external electrodes 205, 206, and 207. The semiconductor chip is sealed in the glass sealing material, with the electrodes remaining pressed against the connection ends of the corresponding external electrode terminals.

As the glass material 211 is thermally shrunk when cured, its shrinking action permits the external source electrode 205 and the external gate electrode 206 to remain under the pressure of the glass material after the load for pressing down is removed. Accordingly, the source electrode 202, the gate electrode 203, and the drain electrode 204 of the MOSFET device can securely have electrical connection to their corresponding external electrode terminals 205, 206, and 207.

Alternatively, the electrodes of the semiconductor chip may be connected to the corresponding external electrode terminals by a high-temperature fusible brazing material which contains silver as a main ingredient as described in the embodiment 1.

(Embodiment 3)

Figure 3A:
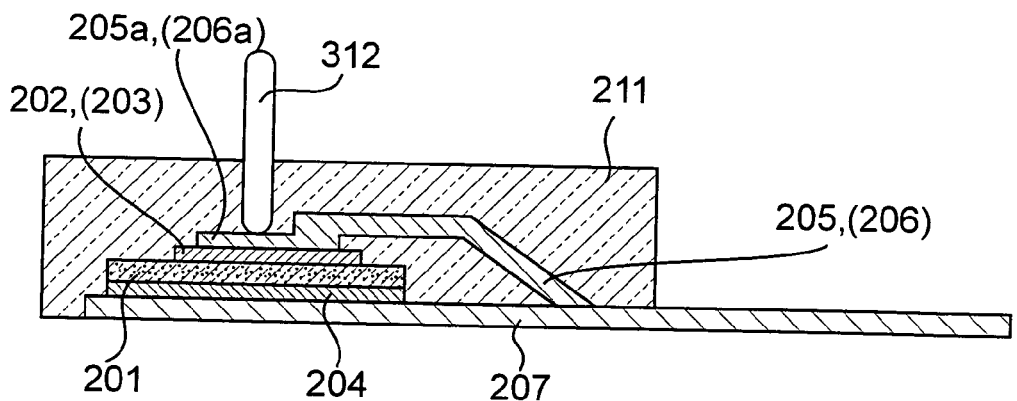
FIGS. 3A, 3B and 3C are cross sectional views schematically showing steps of manufacturing the semiconductor device shown in FIGS. 2A and 2B.
Figure 3B:
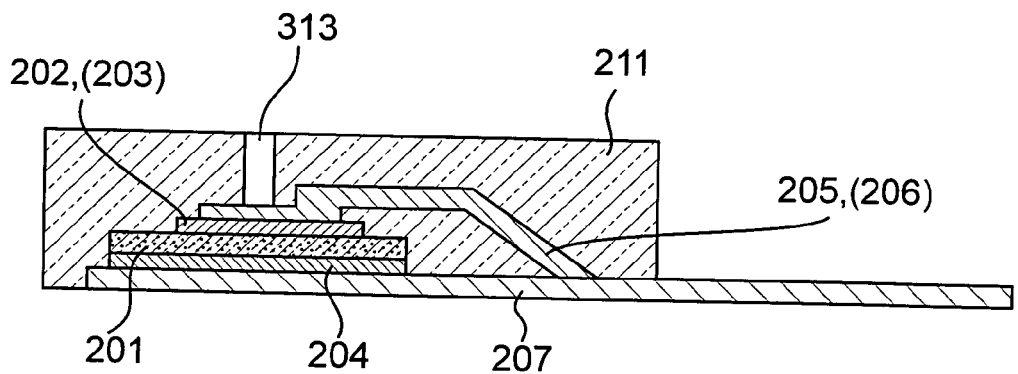
Figure 3C:
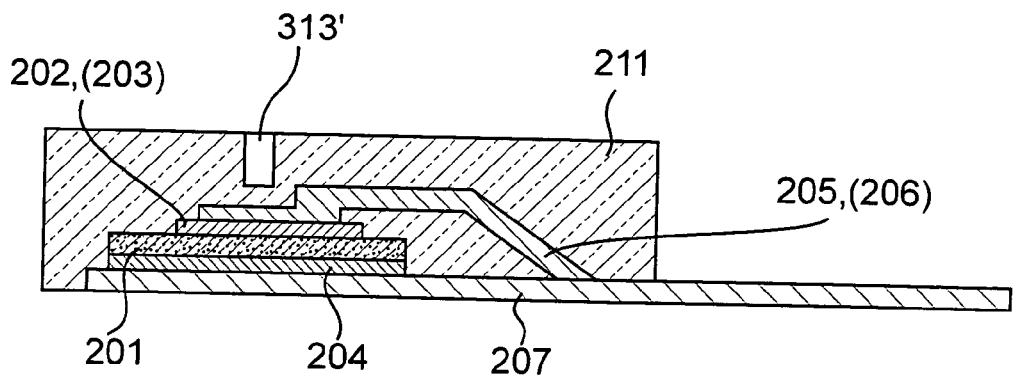

A method of manufacturing a semiconductor device of an embodiment 3 will now be described referring to FIGS. 3A, 3B, and 3C. FIGS. 3A, 3B, and 3C are cross sectional views schematically showing steps of manufacturing method. As shown in the figures, the source electrode 202 (or the gate electrode 203) is electrically connected under the pressure of a pressing contactor 312 to the corresponding external source electrode terminal 205 (or the external gate electrode terminal 206). FIG. 3A illustrates the semiconductor chip with each electrode remaining pressed down by the pressing contactor and encapsulated with the sealing resin material. FIG. 3B illustrates a condition where the pressing contactor having been removed after the sealing resin material is completely cured. FIG. 3C illustrates a condition where the pressing contactor having been removed when the sealing resin material is half hardened before completely cured, and then the sealing resin material is completely cured.

Firstly the semiconductor chip 201 is placed with its lower side directly on and connected via the drain electrode 204 to the metal frame 207 which serves as the external drain electrode terminal, as shown in FIG. 3A. Then, one end 205a of the external electrode terminal 205 (or one end 206a of the external gate electrode terminal 206) is made abut on the upper surface of the source electrode 202 (or the gate electrode 203) provided on the semiconductor chip 201. With the pressing contactor 312 remaining pressed down against the upper surface of the one end 205a of the external source electrode terminal 205 (or the one end 206a of the external gate electrode terminal 206), at least the semiconductor chip 201 is encapsulated with the glass material 211. Preferably, the semiconductor chip 201 is encapsulated together with its source, gate, and drain electrodes and the connection ends of their corresponding external electrode terminals 205, 206, and 207 with the glass sealing material 211. As the electrodes are encapsulated together with the connection ends of their corresponding external terminals with the glass material, the semiconductor device can remain stable in the electrical conduction and be improved in the mechanical strength.

Then, as the glass sealing material 211 has completely been cured, the pressing contactor 312 is removed as shown in FIG. 3B. This allows the glass sealing material 211 to have a hole 313 provided therein by insertion and removal of the pressing contactor 312. The hole 313 extends down to the end 205a of the external source electrode terminal 205 (or the end 206a of the external gate electrode terminals 206).

Alternatively, as the glass sealing material 211 has been half hardened any time before completely cured, the pressing contactor 312 may be removed as shown in FIG. 3C. This allows the glass sealing material 211 to have a hole 313' provided therein by insertion and removal of the pressing contactor 312. The hole 313' extends not so deep as that shown in FIG. 3B, thus allowing the end 205a of the external source electrode terminal 205 (or the end 206a of the external gate electrode terminals 206) to be protected with the glass sealing material 211 which has been hardened slowly.

The foregoing arrangement of the semiconductor device of this embodiment requires no need of bonding metal wires by e.g. ultrasonic fusing which is employed in the embodiment 1 and can thus be simplified in the manufacturing procedure and free from deterioration of the metal wires due to the conduction of a current. Also, as the semiconductor device is arranged operable at a higher temperature with no damage at each connection from the thermal cycling, its operational reliability can be improved.

The electrodes of the semiconductor chip are connected to their corresponding external terminals by a non-soldering technique. As the result, the semiconductor device can be decreased in the number of manufacturing steps thus elevating the productivity and improved in the heat resistance, and also the manufacturing cost can be minimized. Moreover, the semiconductor chip is encapsulated with the sealing material with its electrodes connected under the pressure to the corresponding external electrode terminals, its contact resistance can be improved.

Since the electrodes of the semiconductor chip are connected under the pressure to the corresponding external electrode terminals, their capability of releasing the heat can be enhanced.

Since the connection to the corresponding external electrode terminals is made by no means of metal wires, no heat-up nor voltage drop over the metal wires can be generated even at a higher current.

Since the connection with metal wires is not required during the assembling of any semiconductor power module, the overall productivity can be increased.

Since the semiconductor device is based on a wide-gap chip, its resistance to heat can further be improved.

Alternatively, while the electrodes of the semiconductor chip are connected under the pressure of the pressing contactors to the corresponding external electrode terminals, they may physically be connected together by a high-temperature fusible brazing material which contains silver as a main ingredient and is identical to that of the embodiment 1.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor device having a sealing structure for a semiconductor chip, comprising:
   a plurality of main electrodes, at least some of the main electrodes being provided on each of at least two different main surfaces of the semiconductor chip;
   a plurality of external electrodes electrically connected to the main electrodes via connection members, respectively;
   a sealing member made of a glass based sealing material for encapsulating at least the semiconductor chip, the main electrodes and the connection members; and
   a brazing member made of a silver based brazing material having a high fusing point, which is integrally connected between a part of the main electrodes and a part of the external electrodes,
   wherein the semiconductor chip is of a wide gap type, and the fusing point of the glass based sealing material is lower than that of the silver based brazing material.

2. The semiconductor device according to claim 1, wherein the brazing material is configured to dissipate heat to the outside.

3. A semiconductor device having a sealing structure for a semiconductor chip, comprising:
   a plurality of main electrodes, at least some of the main electrodes being provided on each of at least two different main surfaces of the semiconductor chip;
   a plurality of external electrodes in direct physical contact with and electrically connected to the main electrodes by pressure contact, respectively; and
   a sealing member made of a glass based sealing material configured to encapsulate at least the semiconductor chip, the main electrodes and connected portions of the external electrodes,
   wherein the semiconductor chip is of a wide gap type.

4. The semiconductor device according to claim 1, wherein the semiconductor chip includes one of silicon carbide or gallium nitride.

5. The semiconductor device according to claim 3, wherein the semiconductor chip includes one of silicon carbide or gallium nitride.

6. A semiconductor device having a sealing structure for a semiconductor chip, comprising:
   a plurality of main electrodes, at least some of the main electrodes being provided on each of at least two different main surfaces of the semiconductor chip;
   a plurality of external electrodes;
   means for maintaining direct physical and electrical contact of at least one of the external electrodes with a corresponding at least one of the main electrodes by applying pressure thereto; and
   a sealing member made of a glass based sealing material configured to encapsulate at least the semiconductor chip, the main electrodes and connected portions of the external electrodes,
   wherein the semiconductor chip is of a wide gap type.

7. The semiconductor device according to claim 6, wherein the semiconductor chip includes one of silicon carbide or gallium nitride.

* * * * *